(12) United States Patent  (10) Patent No.: US 8,183,463 B2
Sato et al.  (45) Date of Patent: May 22, 2012

(54) PLATING FILM, PRINTED WIRING BOARD, AND MODULE SUBSTRATE

(75) Inventors: Atsushi Sato, Tokyo (JP); Hisayuki Abe, Tokyo (JP); Takashi Ota, Tokyo (JP); Miyuki Yanagida, Tokyo (JP); Masumi Kameda, Tokyo (JP)

(73) Assignee: TDK Corporation, Tokyo (JP)

( * ) Notice: Subject to any disclaimer, the term of this patent is extended or adjusted under 35 U.S.C. 154(b) by 54 days.

(21) Appl. No.: 12/869,095

(22) Filed: Aug. 26, 2010

(65) Prior Publication Data

US 2011/0048774 A1  Mar. 3, 2011

(30) Foreign Application Priority Data

Sep. 2, 2009 (JP) ................................ P2009-202761
Jun. 8, 2010 (JP) ................................ P2010-130996

(51) Int. Cl.
*H05K 1/09* (2006.01)
(52) U.S. Cl. ......... 174/257; 174/256; 174/263; 361/767
(58) Field of Classification Search .................. 361/760, 361/767; 174/255, 256, 257, 259, 263
See application file for complete search history.

(56) References Cited

U.S. PATENT DOCUMENTS

| | | | |
|---|---|---|---|
| 4,626,479 A * | 12/1986 | Hosoi et al. ................ | 428/663 |
| 6,358,630 B1 * | 3/2002 | Tsukada et al. .............. | 428/646 |
| 6,548,898 B2 * | 4/2003 | Matsuki et al. .............. | 257/746 |
| 6,791,818 B1 * | 9/2004 | Shimoyama et al. ......... | 361/302 |
| 2001/0023771 A1 * | 9/2001 | Izumi et al. ................... | 174/52.1 |
| 2003/0080092 A1 * | 5/2003 | Arvin et al. .................. | 216/83 |
| 2003/0151141 A1 * | 8/2003 | Matsuki et al. .............. | 257/746 |
| 2003/0194485 A1 | 10/2003 | Rhee et al. | |
| 2005/0003677 A1 | 1/2005 | Dean et al. | |
| 2005/0253263 A1 * | 11/2005 | Sugimoto et al. ............. | 257/737 |
| 2006/0147683 A1 | 7/2006 | Ikeda et al. | |
| 2006/0209497 A1 * | 9/2006 | Ooi et al. ..................... | 361/600 |
| 2007/0104929 A1 | 5/2007 | Yim et al. | |
| 2010/0243300 A1 * | 9/2010 | Amin et al. .................. | 174/257 |

FOREIGN PATENT DOCUMENTS

| | | |
|---|---|---|
| EP | 0 475 567 A2 | 3/1992 |
| EP | 1 009 202 A1 | 6/2000 |
| EP | 1 080 823 A2 | 3/2001 |
| JP | A-2008-177261 | 7/2008 |
| WO | WO 2006/112215 A1 | 10/2006 |

OTHER PUBLICATIONS

Extended Search Report issued in corresponding European Application No. 10174785.5 dated Mar. 11, 2011.

* cited by examiner

*Primary Examiner* — Hoa C Nguyen
(74) *Attorney, Agent, or Firm* — Oliff & Berridge, PLC

(57) ABSTRACT

The present invention provides a plating film 50 including a nickel plating layer containing phosphorus and a gold plating layer formed on the nickel plating layer, wherein the nickel plating layer has a phosphorus content of 11 to 16 mass %, and wherein $(3 \times \sigma \times 100)/X$ is 10 or less, where X and σ are the average value and standard deviation of the phosphorus content in a surface of the nickel plating layer on the gold plating layer side, respectively; and a module substrate 100 having the plating film 50.

15 Claims, 9 Drawing Sheets

(a)

(b)

(c)

PLATING FILM, PRINTED WIRING BOARD, AND MODULE SUBSTRATE

BACKGROUND OF THE INVENTION

1. Field of the Invention

The present invention relates to a plating film, and to a printed wiring board and a module substrate having the plating film.

2. Related Background Art

Package substrates made by connecting module substrates mounted with various electronic components to a motherboard and the like have been in use for electronic instruments. Typically, such a module substrate is connected to the motherboard by solder-joining electrode terminals on its surface to conductor sections of the motherboard, whereby the electronic components mounted on the module substrate are allowed to function.

From the viewpoint of securing reliability in the electronic instruments such as those mentioned above, it is required that the connection between the module substrate and motherboard, and the connection between the electronic component and module substrate be hard to break. Therefore, electrode terminals of the module substrate and the like used for connecting with the motherboard are demanded to be excellent in soldering property and solder joint strength which is evaluated by a solder ball pull test. In response to such demands, it has been proposed to adjust the composition and thickness of plating films disposed on surfaces of connection terminals (see, for example, Japanese Patent Application Laid-Open No. 2008-177261).

SUMMARY OF THE INVENTION

Meanwhile, module substrates and electronic components incorporated in the electronic instruments are required to have various characteristics according to purposes of the electronic instruments. Therefore, plating films disposed on electrode terminals of module substrates such as those mentioned above are demanded to have different characteristics according to purposes of the electronic instruments. For example, it is necessary for the plating films disposed on module substrates and their terminal electrodes incorporated in electronic instruments such as mobile phones which are carried daily to have durability to withstand shocks caused by falling.

However, as a result of studies, the inventors have found that, when a module substrate or the like is solder-joined and mounted to a motherboard by using an electrode terminal having a conventional plating film, even the electrode terminal having excellent solder joint strength is easy to break upon a shock caused by falling or the like.

In view of the circumstances mentioned above, it is an object of the present invention to provide a plating film which can achieve sufficiently excellent drop strength when connected by soldering or the like. It is another object of the present invention to provide a printed wiring board and a module substrate which, by providing an electrode terminal with the plating film as mentioned above, do not easily break electric connections even when a shock of falling or the like is applied thereto.

For achieving the above-mentioned objects, the present invention provides a plating film comprising a nickel plating layer containing phosphorus and a gold plating layer formed on the nickel plating layer, wherein the nickel plating layer has a phosphorus content of 11 to 16 mass %, and wherein $(3 \times \sigma \times 100)/X$ is 10 or less, where X and σ are the average value and standard deviation of the phosphorus content in a surface of the nickel plating layer on the gold plating layer side, respectively.

A printed wiring board and a module substrate to which an electrode terminal having the plating film of the present invention on its surface is connected by solder or the like has sufficiently excellent drop strength. It is not completely clear why such an effect is obtained, but the inventors infer as follows. When the phosphorus content in the nickel plating layer is less than 11 mass %, at the time of forming the gold plating film or joining with solder, nickel diffuses from the nickel plating layer at such a high speed that a region lacking in nickel may occur, thereby generating voids in connecting sections. Also, crystal particles of intermetallic compounds formed on the nickel plating layer at the time of solder-joining may become bulky. When the phosphorus content in the nickel plating layer exceeds 16 mass %, on the other hand, the nickel plating layer may become so brittle that the drop strength decreases. That is, the nickel plating layer having a phosphorus content of 11 to 16 mass % is not brittle in itself, while the nickel diffusion speed from the nickel plating layer is so low that the nickel plating layer is harder to corrode, whereby voids can be inhibited from occurring. Also, the crystal particles of intermetallic compounds formed on the nickel plating layer at the time of solder-joining can, be made finer.

The surface of the nickel plating layer on the gold plating layer side has a sufficiently small value of $(3 \times \sigma \times 100)/X$ and thus can inhibit the nickel plating layer from locally corroding. When the value of $(3 \times \sigma \times 100)/X$ increases, the drop strength decreases remarkably, while the solder ball pull strength hardly changes. This seems to result from the fact that, unlike the ball pull strength, the drop strength is susceptible to the fine structure at the joint interface.

That is, the present invention is based on the inventors' original finding that not only the phosphorus content but also the value of $(3 \times \sigma \times 100)/X$ is required to be made smaller in order to improve the drop strength. Making the phosphorus content in the nickel plating layer fall within a specific range while setting the value of $(3 \times \sigma \times 100)/X$ to a specific value or less according to such finding can inhibit the nickel plating film from corroding and finely divide crystal particles of intermetallic compounds, thereby yielding a plating film having sufficiently excellent drop strength. Such a drop strength improving effect is obtained remarkably in particular when lead-free Sn—Ag—Cu-based solder, which becomes hard and is likely to break upon the shock of falling or the like, is used in place of Sn—Pb-based solder.

Preferably, the phosphorus content in the nickel plating layer in the plating film of the present invention is higher as the gold plating layer is nearer. This makes it harder for nickel to diffuse from the nickel plating layer at the time of solder-joining, whereby voids can fully be inhibited from occurring in connecting sections. As a consequence, when joined by solder or the like, a plating film having further excellent drop strength can be obtained.

The present invention also provides a printed wiring board comprising a connection terminal having the above-mentioned plating film. The printed wiring board of the present invention has a connection terminal comprising a plating film having the features mentioned above and thus exhibits excellent drop strength.

The present invention further provides a module substrate comprising a connection terminal having the above-mentioned plating film and an electronic instrument electrically connected to the connection terminal. Such a module substrate is equipped with a connection terminal having the plating film exhibiting the above-mentioned features and thus exhibits excellent drop strength without easily breaking the electric connection to the motherboard or the like even if the shock of falling or the like is applied thereto when mounted to an electronic device.

The present invention can provide a plating film which can achieve sufficiently excellent drop strength when, connected with solder or the like. The present invention can also provide a printed wiring board and a module substrate which, by having such a plating film as an electrode terminal, does not easily break electric connections even when the shock of falling or the like is applied thereto. Such plating film, printed wiring board, and module substrate are useful in particular in electronic instruments, such as mobile phones, which are carried.

DESCRIPTION OF THE PREFERRED EMBODIMENTS

Figure 1:
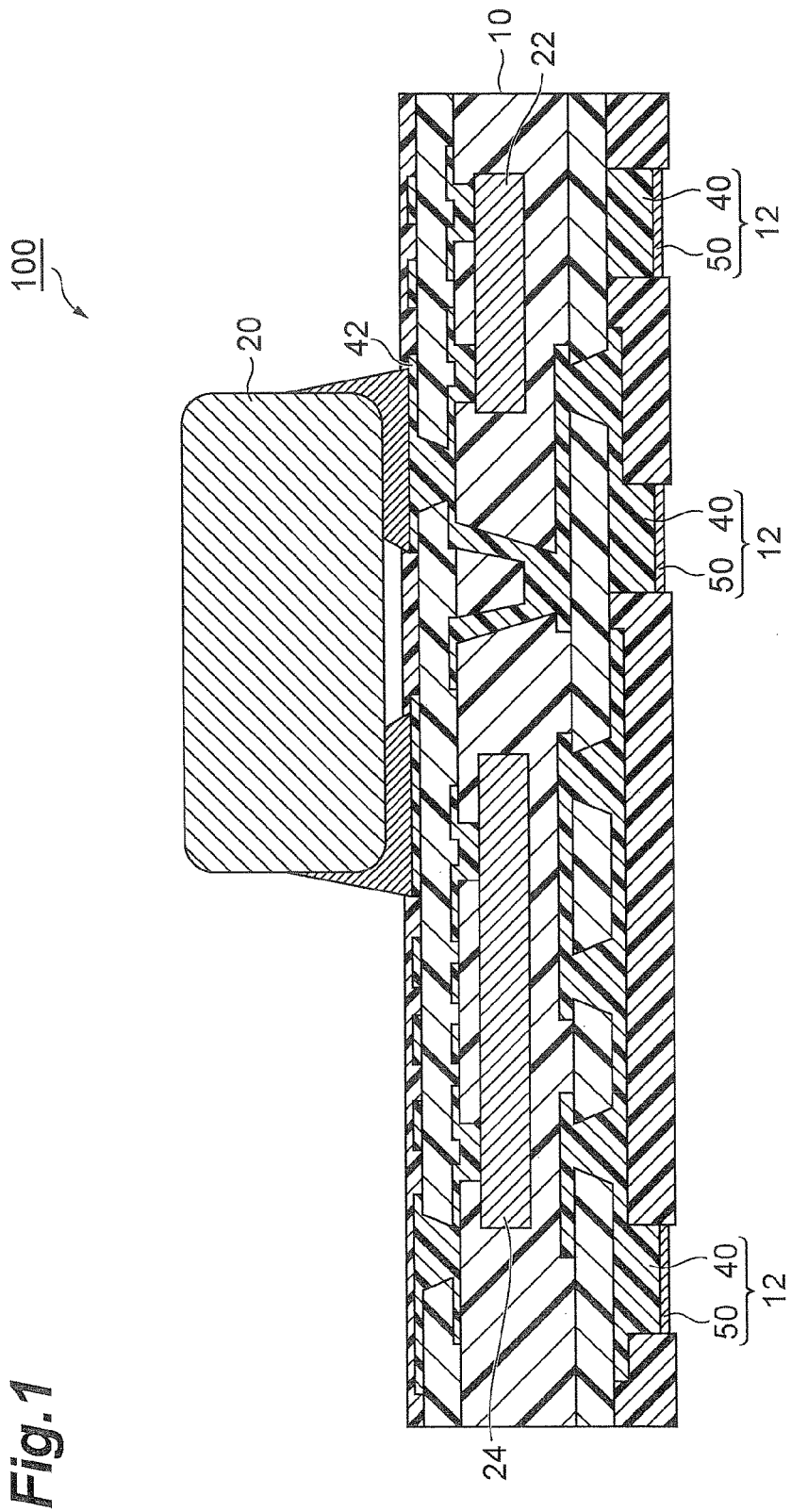
FIG. 1 is a sectional view schematically illustrating a preferred embodiment of the module substrate in accordance with the present invention.

In the following, preferred embodiments of the present invention will be explained with reference to the drawings as the case may be. In the drawings, the same or equivalent constituents will be referred to with the same signs while omitting their overlapping descriptions.

FIG. 1 is a sectional view schematically illustrating a preferred embodiment of the module substrate in accordance with the present invention.

A module substrate 100 has a chip capacitor 20 on one surface of a substrate 10, while the chip capacitor 20 is connected to electrode terminals 42. A capacitor 22 and an IC chip 24 are embedded in the substrate 10 and connected to each other with copper wiring.

The module substrate 100 has electrode terminals 12 which are connection terminals on the other surface of the substrate 10. Each electrode terminal 12 has a plating film 50 on a copper terminal 40. The plating film 50 has a structure in which a nickel plating film and a gold plating film are laminated in this order from the copper terminal 40 side.

Figure 2:
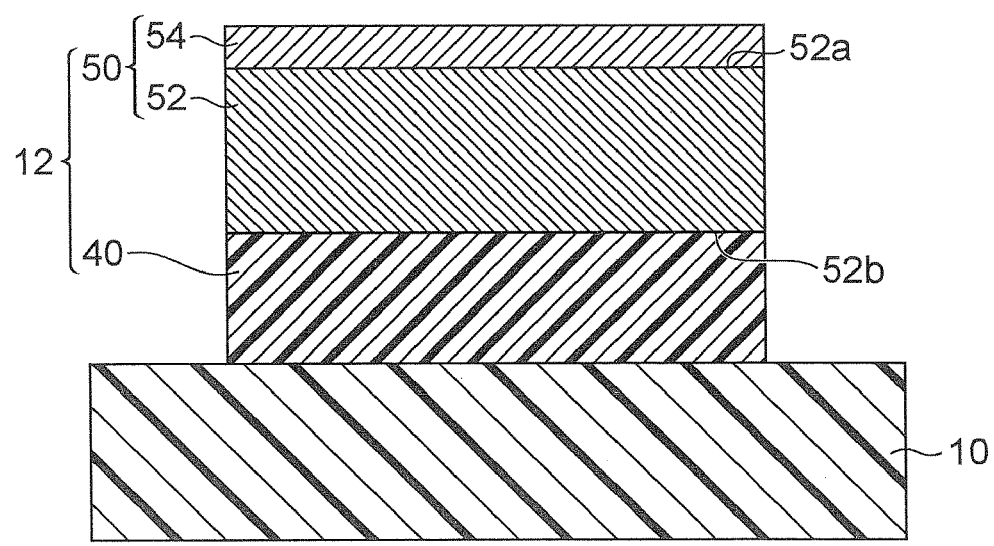
FIG. 2 is a sectional view schematically illustrating a cross-sectional structure of an electrode terminal of the module substrate that is a preferred embodiment of the present invention.

FIG. 2 is a sectional view schematically illustrating a cross-sectional structure of the electrode terminal 12 of the module substrate 100. On the copper terminal 40, the electrode terminal 12 has the plating film 50 in which a nickel plating layer 52 and a gold plating layer 54 are laminated in this order from the copper terminal 40 side.

The nickel plating layer 52 contains nickel and phosphorus as main components. The phosphorus content in the nickel plating layer 52 is 11 to 16 mass %, preferably 12 to 15 mass %. Though the nickel plating layer 52 may contain components (e.g., palladium, gold, and copper) other than the above-mentioned main components, the content of the main components in the nickel plating layer 52 is preferably at least 95 mass %, more preferably at least 99 mass %, further preferably at least 99.5 mass %.

The phosphorus content and nickel content may vary thickwise in the nickel plating layer 52. For example, it will be preferred if the phosphorus content is higher as the gold plating layer 54 is nearer. Specifically, letting P1 (mass %) be the phosphorus content in a contact surface 52b of the nickel plating layer 52 with the copper terminal 40 and P2 (mass %) be the phosphorus content in a contact surface 52a of the nickel plating layer 52 with the gold plating layer 54, P2/P1 is preferably 1.05 to 1.8, more preferably 1.1 to 1.5, further preferably 1.2 to 1.4. When P2/P1 is less than 1.05, voids tend to occur easily in the nickel layer in contact with the copper terminal 40. When P2/P1 exceeds 1.8, on the other hand, nickel is harder to diffuse into solder at the time of soldering, which makes it difficult for an alloy layer to form, whereby the joint strength tends to decrease.

The content of each element in the nickel plating layer 52 can be measured by analyzing the nickel plating layer 52 in a cross section of the plating film 50 with a commercially available energy dispersive X-ray spectroscopy (EDS) system. The ratio of change in the phosphorus (or nickel) content in the thickness direction of the nickel plating layer 52 can be determined by measuring the content of each element along the thickness direction with an XPS system.

In the contact surface 52a of the nickel plating layer 52, the value Y determined by the following expression (1) is 10 or less, preferably 9 or less, more preferably 8 or less. When Y is 9 or less, voids are more inhibited from occurring upon connection by solder or the like, so as to yield a module substrate having more excellent drop strength. When Y is 8 or less, voids are further inhibited from occurring upon connection by solder or the like, so as to yield a module substrate having further excellent drop strength. The lower limit for Y is preferably at least 1 from the manufacturing viewpoint. When Y is less than 1, the surface of the alloy layer formed at the time of soldering tends to become smooth, thereby losing excellent joining property. Making Y smaller than 1 also tends to increase the cost of manufacture. In the following expression (1), σ (standard deviation) and X (average value in mass %) can be obtained by selecting seven or more different positions in a cross section of the nickel plating layer 52, determining respective phosphorus contents (mass %) at these positions by XPS analysis, and calculating the average value and standard deviation of thus determined values.

$$Y = 3 \times \sigma \times 100 / X \quad (1)$$

From the viewpoint of attaining favorable joint strength and drop strength at the same time, the thickness of the nickel plating layer 52 is preferably 1 to 20 μm, more preferably 2 to 10 μm, further preferably 2 to 6 μm.

The gold plating layer 54 contains gold as a main component and may include a small amount of nickel. It may further contain palladium as another trace component. From the viewpoint of achieving economy and solder adhesion at the same time, the thickness of the gold plating layer 54 is preferably 0.01 to 1 μm, more preferably 0.03 to 0.5 μm, further preferably 0.05 to 0.2 μm.

The substrate 10 in the module substrate 100 may be either a resin substrate made of an epoxy resin or the like or a glass-ceramics substrate. In the case of a resin substrate, the substrate 10 can be formed by subjecting a commercially available printed wiring board to copper through-hole plating. In the case of a glass-ceramics substrate, the substrate 10 can be made as follows. First, using a dielectric paste containing a glass powder, a binder, a solvent, a plasticizer, a dispersant, and the like, a green sheet is formed by doctor blading or the like. Subsequently, a conductive paste containing a conductive material made of any of various conductive metals and alloys such as Ag, Ag—Pd alloys, Cu, and Ni and an organic vehicle is applied onto the green sheet, via holes are formed therein, and so forth, so as to make a conductor pattern having a predetermined form. Thereafter, a plurality of green sheets formed with conductor patterns are laminated when necessary, pressed, and fired, whereby a multilayer glass-ceramics substrate can be obtained. A monolayer glass-ceramics substrate can be obtained by firing without the above-mentioned lamination.

The substrate 10 may be provided with various electronic components such as filters, ICs, and capacitors. Connecting these electronic components to electrode terminals of the substrate 10 with solder and the like yields the module substrate 100.

A method of forming the plating film 50 on the copper terminal 40 of the module substrate 100 will now be explained. The method of forming the plating film 50 comprises a degreasing step for degreasing the surface of the copper terminal 40, a pre-dip step, an activation step, a post-dip step, an electroless nickel plating step, an electroless palladium plating step, and an electroless gold plating step. The individual steps will now be explained in detail.

The degreasing step may be carried out with a commercially available degreasing solution. Preferably, the copper terminal 40 of the module substrate 100 is immersed in the degreasing solution, then taken out therefrom, and washed with water.

The pre-dip step may use an activation solution identical to that employed in the subsequent activation step. Performing the pre-dip step can inhibit the concentration of effective components in the activation solution in the activation step from fluctuating.

The activation step may be carried out with a commercially available activation solution. The post-dip step may be carried out with a commercially available post-dip solution. The post-dip step can remove palladium components and the like attached to nonconductor parts in the previous step.

The electroless nickel plating step immerses the copper terminal 40 into a commercially available electroless nickel plating solution, so as to form an electroless nickel plating film. Here, the temperature of the electroless nickel plating solution is preferably 50 to 95° C., more preferably 60 to 90° C. The phosphorus content in the electroless nickel plating solution is preferably 10 to 13 mass %. Preferably, the pH of the electroless nickel plating solution is adjusted to 5.0 to 6.0 by using dilute sulfuric acid or aqueous ammonia, for example.

The electroless palladium plating step forms an electroless palladium plating film having a thickness of 0.01 to 0.2 μm on the surface of the electroless nickel plating film by using a commercially available electroless palladium plating solution. Thus forming the electroless palladium plating film can inhibit the electroless nickel plating film from corroding at the time of carrying out displacement gold plating.

The electroless gold plating step forms a gold plating film by using a commercially available electroless gold plating solution. Here, since the phosphorus content in the nickel plating film is high, nickel is restrained from being eluted, whereby the corrosion of the electroless nickel plating film can fully be suppressed.

The foregoing steps can form the plating film 50 in which the nickel plating layer 52 made of an electroless nickel plating film and the gold plating layer 54 made of an electroless gold plating film are laminated in this order on the copper terminal 40.

A method of connecting the module substrate in accordance with an embodiment of the present invention to a motherboard with solder will now be explained.

Figure 3:
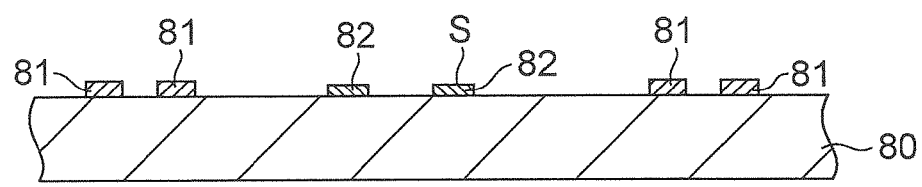
FIG. 3 is a process chart schematically illustrating the first half of a method of connecting a module substrate which is an embodiment of the present invention to a motherboard.
Figure 3:
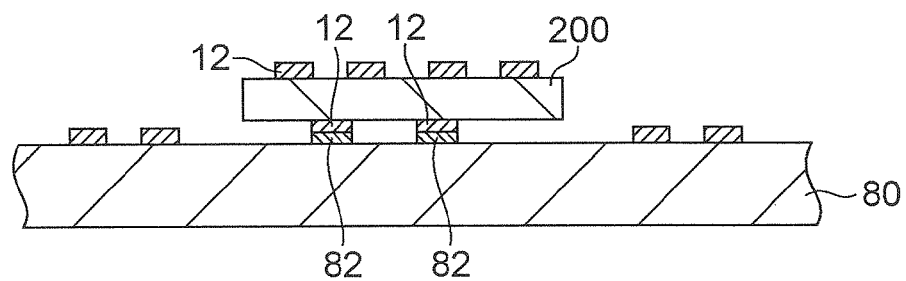
Figure 3:
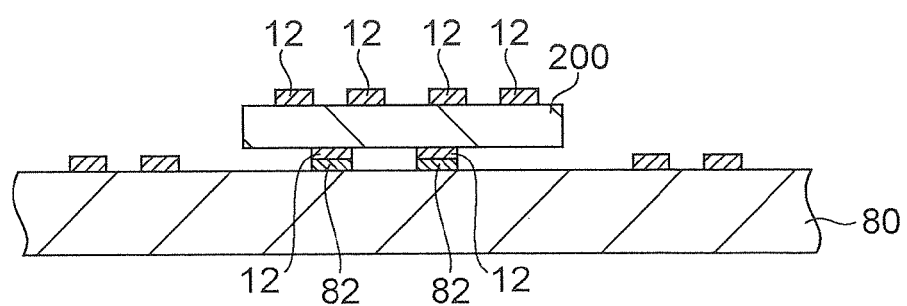
Figure 4:
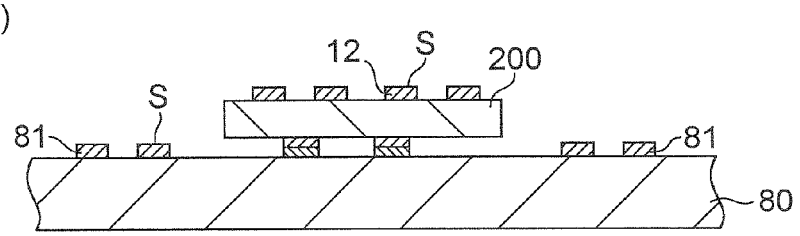
FIG. 4 is a process chart schematically illustrating the second half of the method of connecting the module substrate that is an embodiment of the present invention to the motherboard.
Figure 4:
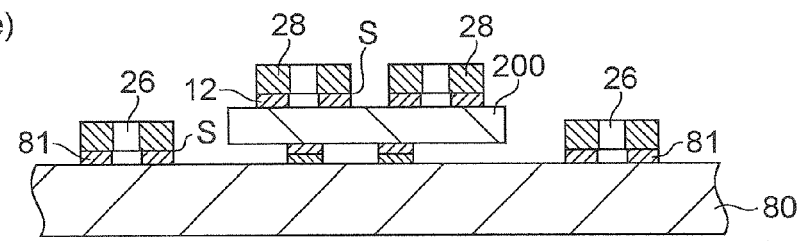
Figure 4:
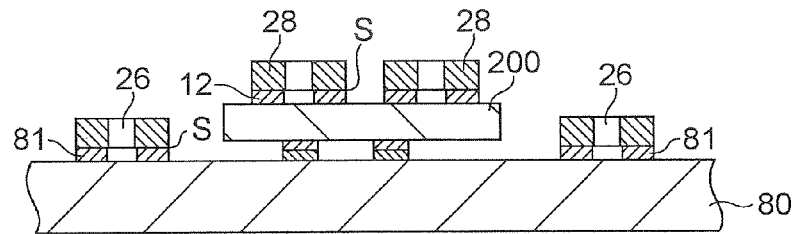

FIGS. 3 and 4 are process charts schematically illustrating the method of connecting a module substrate 200 which is an embodiment of the present invention to a motherboard 80. This connecting method comprises a first solder application step [FIG. 3(a)], a substrate mount step [FIG. 3(b)], a first solder reflow step [FIG. 3(c)], a second solder application step [FIG. 4(d)], a component mount step [FIG. 4(e)], and a second solder reflow step [FIG. 4(f)]. The method of connecting the module substrate 200 to the motherboard 80 will now be explained with reference to FIGS. 3 and 4.

The first solder application step illustrated in FIG. 3(a) prepares the motherboard 80 having electrode terminals 81 and 82. Cream solder S is applied to the surface of the plating film. The cream solder S may be applied by printing through a metal mask. The cream solder S is not limited to any specific kind in particular; one containing Sn—Pb—or Sn—Ag—Cu-based solder may be used.

The substrate mount step illustrated in FIG. 3(b) causes the rear face of the module substrate 200 having the electrode terminals 12 and the front face of the motherboard 80 to oppose each other, aligns the electrodes 12 with their corresponding electrode terminals 82 such that they conic into contact with each other through the solder S, and mounts the module substrate 200 onto the motherboard 80.

The first solder reflow step illustrated in FIG. 3(c) heats the motherboard 80 and the module substrate 200 mounted on the motherboard 80 in a solder reflow furnace and then cools them. The cream solder S is melted by the heating and then solidified by the cooling, whereby the electrode terminals 12 and 82 are connected to each other. As a consequence, the module substrate 200 and the motherboard 80 are connected and integrated to each other.

Figure 5:
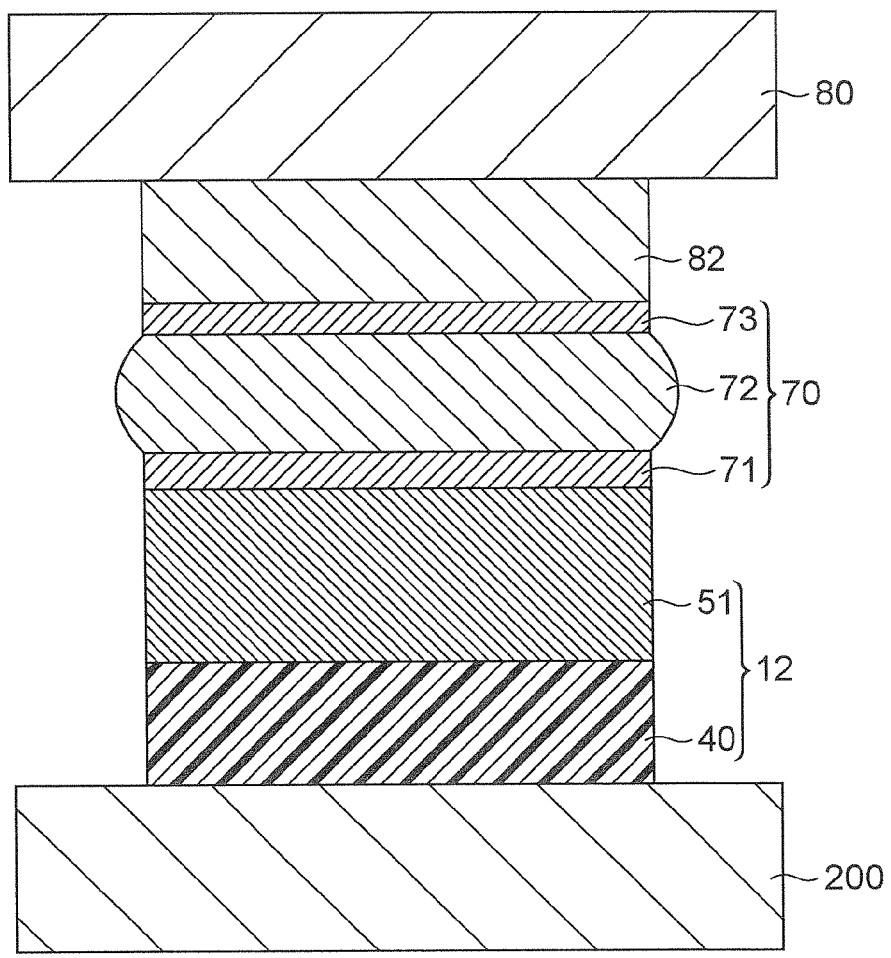
FIG. 5 is a sectional view schematically illustrating the state of connection between an electrode terminal of the module substrate and an electrode terminal of the motherboard after the first solder reflow step in the method of connecting the module substrate that is an embodiment of the present invention.

FIG. 5 is a sectional view schematically illustrating the state of connection between the electrode terminal 12 of the module substrate 200 and the electrode terminal 82 of the motherboard 80 after the first solder reflow step. In the first solder reflow step, nickel diffuses from the nickel plating layer 51 in the surface part of the electrode terminal 12 to a solder connection layer 70. In the case where the cream solder S contains Sn—Ag—Cu-based solder, an intermetallic compound 71 containing $(Cu, Ni)_6Sn_5$ or the like occurs on the plating film 12 side of the solder connection layer 70. On the other hand, an intermetallic compound 73 such as $Cu_3Sn_4$ is produced on the electrode terminal 82 side of the solder connection layer 70. A solder layer 72 has a composition of Sn-3Ag-0.5Cu, for example.

The electrode terminal 12 has the plating film 50 including the nickel plating layer 52 with a high phosphorus content and thus can reduce the amount of diffusion of nickel from the nickel plating layer into the solder connection layer 70 at the time of being joined to the electrode terminal 82 through the cream solder S. Since the fluctuation in phosphorus content in the surface of the nickel plating layer on the solder connection layer 70 side is sufficiently lowered, the amount of diffusion of nickel at the time of connection is fully restrained from fluctuating. This can inhibit voids from occurring in connecting sections, e.g., an interface section between the intermetallic compound 71 and the plating film 50. This can achieve sufficiently excellent drop strength even when the cream solder S containing Sn—Ag—Cu-based solder is used.

The second solder application step illustrated in FIG. 4(*d*) applies the cream solder S onto the electrode terminals 81 and 12 of the motherboard 80 and module substrate 200 in the integrated state. The cream solder S may be applied by printing through a metal mask. The electrode terminal 81 may have a plating film 50 similar to that of the electrode terminal 12 on its surface part.

The component mount step illustrated in FIG. 4(*e*) mounts electronic components 26, 28 on the electrode terminals 81, 12 coated with the cream solder S such that the electrode terminals 81, 12 oppose their corresponding terminals of the electronic components 26, 28.

The second solder reflow step illustrated in FIG. 4(*f*) heats the motherboard 80 and module substrate 200 mounted with the electronic components 26, 28 in a solder reflow furnace and then cools them. The cream solder S is melted by the heating and then solidified by the cooling, whereby the electrode terminals 81, 12 are connected to their corresponding electronic components 26, 28. A connecting part such as the one illustrated in FIG. 5 is formed at the junction between the electrode terminal 81, 12 having the plating film 50 on its surface part and the electronic component 26, 28.

As mentioned above, when the module substrate of this embodiment is connected to the motherboard, each electrode terminal of the module substrate has a plating film in which the phosphorus content and the value of $(3\times\sigma\times100)/X$ fall within predetermined ranges on its surface part. This can inhibit voids from occurring in connecting sections and finely divide crystal particles of intermetallic compounds occurring at the time of connection. Therefore, a module substrate and electronic instrument having high reliability against shocks of falling and the like can be obtained.

Though preferred embodiments of the present invention have been explained in the foregoing, the present invention is not limited to the above-mentioned embodiments at all. For example, the plating film of the present invention may be provided with not only the module substrates, but also monolayer or multilayer printed wiring boards mounted with no electronic instruments.

EXAMPLES

The present invention will now be explained in more detail with reference to examples and comparative examples, but is not limited to the following examples.

Example 1

Forming of Plating Film

A highly heat-resistant substrate (manufactured by Hitachi Chemical Co., Ltd. under the product name of FR-4 having a thickness of 3 mm) which was a packaging substrate was prepared. The substrate was formed with a through hole by using an NC drill and subjected to through-hole plating. Then, an etching resist having a predetermined fond was made, and unnecessary copper wiring was removed by etching, so as to form a daisy-chain circuit pattern. Thereafter, the surface of the substrate was partly overcoated with a solder resist such that no plating was deposited on unnecessary parts, so as to form a copper terminal (copper pad having a diameter of 0.6 mm) for connecting with a solder ball.

A silicon dummy wafer having a thickness of 0.3 mm was bonded to one surface of the substrate with an adhesive. Then, they were sealed with a resin, so as to yield a substrate having a total thickness of 1.1 mm. This substrate was sequentially subjected to steps which will be explained in the following, so as to form a plating film on the copper terminal of the substrate.

Degreasing Step

The above-mentioned substrate was immersed in a degreasing solution (manufactured by Okuno Chemical Industries Co., Ltd. under the product name of Ace Clean 850) at 40° C. for 3 min, then taken out therefrom, and washed with water for 1 min.

Pre-Dip Step

The substrate was immersed in NNP Accera B (product name manufactured by Okuno Chemical Industries Co., Ltd.) at 25° C. for 30 sec. This step was performed in order to inhibit the content of each ingredient in a plating bath used in the subsequent step from decreasing.

Activation Step

The substrate was immersed in a plating activation solution (manufactured by Okuno Chemical Industries Co., Ltd. under the product name of NNP Accera) at 35° C. for 5 min. Then, the substrate was taken out from the plating activation solution and washed with water for 1 min.

Post-Dip Step

The substrate was immersed in NNP Post Dip 401 (product name manufactured by Okuno Chemical Industries Co., Ltd.) at 25° C. for 2 min, so as to remove Pd components attached to nonconductor parts in the substrate.

Electroless Nickel Plating Step

The pH of an electroless nickel plating solution (manufactured by Okuno Chemical Industries Co., Ltd. under the product name of SOF bath having a phosphorus content of 12 mass %) was adjusted to 5.4 with aqueous ammonia, and the substrate was immersed in thus adjusted electroless nickel plating solution at 85° C. for 20 min. The phosphorus content based on the total of nickel and phosphorus in the electroless nickel plating solution was 12 mass %. Thereafter, the substrate was taken out from the electroless nickel plating solution and washed with water for 1 min.

Electroless Palladium Plating Step

The substrate was immersed in an electroless Pd plating solution (manufactured by Okuno Chemical Industries Co., Ltd. under the product name of Palla Top N bath) at 60° C. for 3 min. Thereafter, the substrate was taken out from the electroless Pd plating solution and washed with water for 1 min.

Electroless Gold Plating Step

The substrate was immersed in an electroless gold plating solution (manufactured by Okuno Chemical Industries Co., Ltd. under the product name of Flash Gold 330 bath) at 85° C. for 25 min and washed with water for 1 min. Thereafter, the substrate was taken out from the electroless gold plating solution and washed with water for 1 min.

The foregoing steps formed a plating film having a nickel plating layer having a phosphorus content of 12 mass % and a gold plating layer on the copper terminal of the substrate in this order from the copper terminal side.

Evaluation of Plating Film

A cross section of the plating film was mirror-polished and then observed with a scanning electron microscope (SEM) and a transmission electron microscope (TEM). By analyzing it with an EDS system (manufactured by JEOL Ltd. under the product name of JXA-8500F) attached to the SEM, the phosphorus content in the whole nickel plating layer was determined. As a result, the phosphorus content was 12 mass %.

Figure 6:
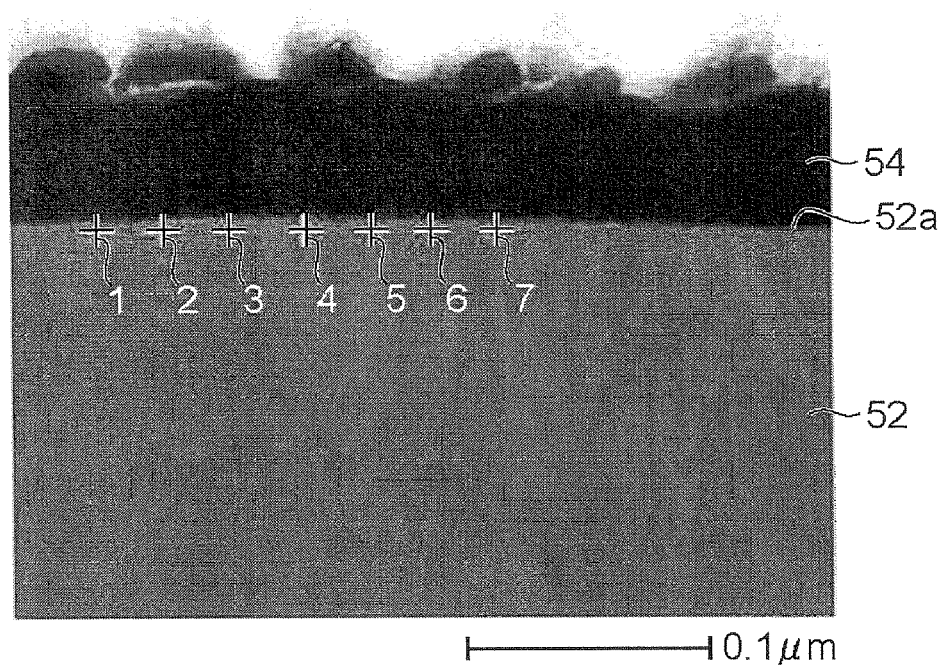
FIG. 6 is a TEM photograph illustrating a cross section of the plating film of Example 1.

FIG. 6 is a TEM photograph illustrating a cross section of the plating film of Example 1. The TEM photograph of FIG. 6 illustrates the contact surface between the nickel plating layer 52 and the gold plating layer 54 under magnification. Using thus magnified cross-sectional image, the phosphorus content and nickel content in the contact surface 52a of the nickel plating layer 52 with the gold plating layer 54 were determined. Specifically, using an X-ray photoelectron spectroscopy (XPS) system (manufactured by Shimadzu Corporation under the product name of AXIS-HSX), the phosphorus content and nickel content were measured at each of points 1 to 7 in FIG. 6. Table 1 lists the results. In the table, Y is the value calculated by the above-mentioned expression (1).

TABLE 1

| Location (point) | P mass % | Ni mass % |
| --- | --- | --- |
| 1 | 14.9 | 85.1 |
| 2 | 15.4 | 84.6 |
| 3 | 14.8 | 85.2 |
| 4 | 15.6 | 84.4 |
| 5 | 15.0 | 85.0 |
| 6 | 15.3 | 84.7 |
| 7 | 15.5 | 84.5 |
| Average (X) | 15.2 | 84.8 |
| SD (σ) | 0.313 | 0.313 |
| Y | 6.18 | — |

SD: Standard Deviation

Figure 7:
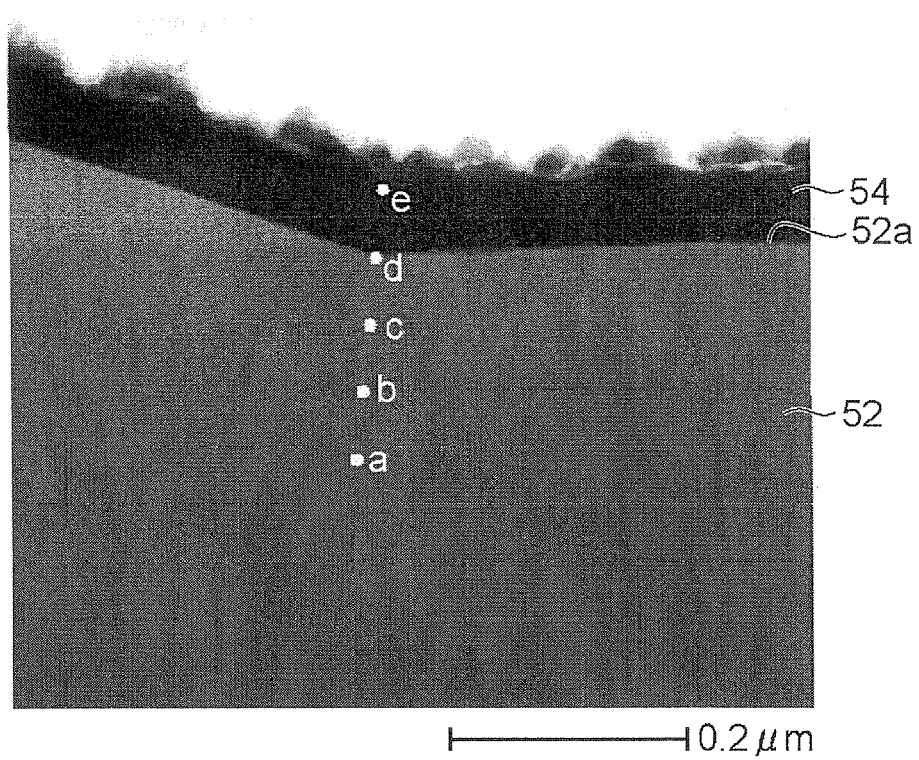
FIG. 7 is a TEM photograph illustrating a cross section of the plating film of Example 1.

FIG. 7 is a TEM photograph illustrating a cross section of the plating film of Example 1. The TEM photograph of FIG. 7 illustrates the contact surface between the nickel plating layer 52 and the gold plating layer 54 under magnification. Using thus magnified cross-sectional image, the phosphorus content, nickel content, and gold content were measured along a direction perpendicular to the contact surface of the nickel plating layer 52 with the gold plating layer 54. Specifically, using an X-ray photoelectron spectroscopy (XPS) system (manufactured by Shimadzu. Corporation under the product name of AXIS-HSX), the phosphorus content, nickel content, and gold content were measured at each of points a, b, c, d, and e in FIG. 7. Table 2 lists the results. The values in Table 2 indicate the respective contents of elements based on the total of phosphorus, nickel, and gold.

TABLE 2

| Location (point) | P mass % | Ni mass % | Au mass % |
| --- | --- | --- | --- |
| a | 13.2 | 86.8 | 0 |
| b | 13.6 | 86.4 | 0 |
| c | 13.6 | 86.4 | 0 |
| d | 15.7 | 78.6 | 5.7 |
| e | 0 | 5.7 | 94.3 |

As obvious from the results of Table 2, the phosphorus content in the nickel plating layer 52 was seen to become higher as the gold plating layer 54 is nearer.

Comparative Example 1

Aqueous ammonia was added to the electroless nickel plating solution used in the electroless nickel plating step of Example 1, so as to adjust its pH and phosphorus content. In the electroless nickel plating solution after the adjustment, the pH was 6.5, while the phosphorus content based on the total of nickel and phosphorus was 2 mass %. A plating film having a nickel plating layer and a gold plating layer on a copper terminal of a substrate in this order from the copper terminal side was formed as in Example 1 except that the electroless nickel plating solution having a phosphorus content of 2 mass % prepared as mentioned above was used in place of the electroless nickel plating solution having a phosphorus content of 12 mass % in the electroless nickel plating step and that the palladium plating step was not carried out. Then, as in Example 1, the phosphorus content in the nickel plating layer was determined. As a result, the phosphorus content in the nickel plating layer as a whole was 2 mass %.

The phosphorus content and nickel content in the contact surface of the nickel plating layer with the gold plating layer were determined as in Example 1. Table 3 lists the results.

Comparative Example 2

Aqueous ammonia was added to the electroless nickel plating solution used in the electroless nickel plating step of Example 1, so as to adjust its pH and phosphorus content. In the electroless nickel plating solution after the adjustment, the pH was 4.5, while the phosphorus content based on the total of nickel and phosphorus was 7 mass %. A plating film having a nickel plating layer and a gold plating layer on a copper terminal of a substrate in this order from the copper terminal side was formed as in Example 1 except that the electroless nickel plating solution having a phosphorus content of 7 mass % prepared as mentioned above was used in place of the electroless nickel plating solution having a phosphorus content of 12 mass % in the electroless nickel plating step. Then, as in Example 1, the phosphorus content in the nickel plating layer as a whole was determined. As a result, the phosphorus content in the whole nickel plating layer was 7 mass %.

The phosphorus content and nickel content in the contact surface of the nickel plating layer with the gold plating layer were determined as in Example 1. Table 3 lists the results.

Comparative Example 3

Aqueous ammonia was added to the electroless nickel plating solution used in the electroless nickel plating step of Example 1, so as to adjust its pH and phosphorus content. In the electroless nickel plating solution after the adjustment, the pH was 4.4, while the phosphorus content based on the total of nickel and phosphorus was 8 mass %. A plating film having a nickel plating layer and a gold plating layer on a copper terminal of a substrate in this order from the copper terminal side was formed as in Example 1 except that the electroless nickel plating solution having a phosphorus content of 8 mass % prepared as mentioned above was used in place of the electroless nickel plating solution having a phosphorus content of 12 mass % in the electroless nickel plating step. Then, as in Example 1, the phosphorus content in the nickel plating layer as a whole was determined. As a result, the phosphorus content in the whole nickel plating layer was 8 mass %.

The phosphorus content and nickel content in the contact surface of the nickel plating layer with the gold plating layer were determined as in Example 1. Table 3 lists the results.

TABLE 3

| Location (point) | Comparative Example 1 | | Comparative Example 2 | | Comparative Example 3 | |
|---|---|---|---|---|---|---|
| | P mass % | Ni mass % | P mass % | Ni mass % | P mass % | Ni mass % |
| 1 | 2.9 | 97.1 | 16.5 | 83.5 | 11.5 | 88.5 |
| 2 | 3.4 | 96.6 | 15.3 | 84.7 | 12.0 | 88.0 |
| 3 | 3.0 | 97.0 | 10.2 | 89.8 | 13.0 | 87.0 |
| 4 | 4.2 | 95.8 | 13.7 | 86.3 | 14.4 | 85.6 |
| 5 | 3.0 | 97.0 | 15.3 | 84.7 | 10.5 | 89.5 |
| 6 | 3.1 | 96.9 | 13.7 | 86.3 | 12.2 | 87.8 |
| 7 | 4.0 | 96.0 | 9.0 | 91.0 | 11.5 | 88.5 |
| Average (X) | 3.4 | 96.6 | 13.4 | 86.6 | 12.2 | 87.8 |
| SD ($\sigma$) | 0.525 | 0.525 | 2.787 | 2.787 | 1.250 | 1.250 |
| Y | 46.72 | — | 62.47 | — | 30.85 | — |

In each of Comparative Examples 1 to 3, the phosphorus content in the contact surface of the nickel plating layer with the gold plating layer was seen to yield larger Y and greater deviation than in Example 1.

Comparative Example 4

Aqueous ammonia was added to the electroless nickel plating solution used in the electroless nickel plating step of Example 1, so as to adjust its pH and phosphorus content. In the electroless nickel plating solution after the adjustment, the pH was 6.5, while the phosphorus content based on the total of nickel and phosphorus was 2 mass %. A plating film having a nickel plating layer and a gold plating layer on a copper terminal of a substrate in this order from the copper terminal side was formed as in Example 1 except that the electroless nickel plating solution having a phosphorus content of 2 mass % prepared as mentioned above was used in place of the electroless nickel plating solution having a phosphorus content of 12 mass % in the electroless nickel plating step. Then, as in Example 1, the phosphorus content in the nickel plating layer was determined. As a result, the phosphorus content in the nickel plating layer as a whole was 2 mass %.

Example 2

Aqueous ammonia was added to the electroless nickel plating solution used in the electroless nickel plating step of Example 1, so as to adjust its pH and phosphorus content. In the electroless nickel plating solution after the adjustment, the pH was 5.6, while the phosphorus content based on the total of nickel and phosphorus was 11 mass %. A plating film having a nickel plating layer and a gold plating layer on a copper terminal of a substrate in this order from the copper terminal side was formed as in Example 1 except that the substrate was immersed in thus adjusted electroless nickel plating solution at 85° C. for 18 min. Then, as in Example 1, the phosphorus content in the nickel plating layer was determined. As a result, the phosphorus content in the nickel plating layer as a whole was 11 mass %.

The phosphorus content and nickel content in the contact surface of the nickel plating layer with the gold plating layer were determined as in Example 1. Table 4 lists the results.

Example 3

Aqueous ammonia was added to the electroless nickel plating solution used in the electroless nickel plating step of Example 1, so as to adjust its pH and phosphorus content. In the electroless nickel plating solution after the adjustment, the pH was 5.8, while the phosphorus content based on the total of nickel and phosphorus was 10 mass %. A plating film having a nickel plating layer and a gold plating layer on a copper terminal of a substrate in this order from the copper terminal side was formed as in Example 1 except that the substrate was immersed in thus adjusted electroless nickel plating solution at 85° C. for 16 min. Then, as in Example 1, the phosphorus content in the nickel plating layer was determined. As a result, the phosphorus content in the nickel plating layer as a whole was 10 mass %.

The phosphorus content and nickel content in the contact surface of the nickel plating layer with the gold plating layer were determined as in Example 1. Table 4 lists the results.

TABLE 4

| Location (point) | Example 2 | | Example 3 | |
|---|---|---|---|---|
| | P mass % | Ni mass % | P mass % | Ni mass % |
| 1 | 13.6 | 86.4 | 13.2 | 86.8 |
| 2 | 14.3 | 85.7 | 13.6 | 86.4 |
| 3 | 13.7 | 86.3 | 12.9 | 87.1 |
| 4 | 13.9 | 86.1 | 13.3 | 86.7 |
| 5 | 14.4 | 85.6 | 14.1 | 85.9 |
| 6 | 14.3 | 85.7 | 12.8 | 87.2 |
| 7 | 14.5 | 85.5 | 13.5 | 86.5 |
| Average (X) | 14.10 | 85.90 | 13.34 | 86.66 |
| SD ($\sigma$) | 0.361 | 0.361 | 0.443 | 0.443 |
| Y | 7.67 | — | 9.96 | — |

In, each of Examples 2 and 3, Y was smaller than that in any of Comparative Examples 1 to 3. This fact proved that the deviation in the phosphorus content in the contact surface of the nickel plating layer with the gold plating layer in each of Examples 2 and 3 was smaller than that in any of Comparative Examples 1 to 3.

Evaluation of Drop Strength

Substrates having the respective plating films made by Examples 1 to 3 and Comparative Examples 1, 3, and 4 were prepared 12 pieces each. Then, 12 evaluation mounting substrates were produced for each of the examples and comparative examples, and their drop strengths were evaluated.

First, a sparkle flux manufactured by Senju Metal Industry Co., Ltd. was printed on each of the electrode terminals having the plating films formed by the examples and, comparative examples, and then a solder ball having a diameter of 0.76 mm (product name: M705) manufactured by Senju Metal Industry Co., Ltd. was attached thereto. Thereafter, each product was caused to pass through a reflow furnace, so as to make a package substrate. The reflow condition was such that the preheat time was 80 sec, the time during which the temperature was 220° C. or higher was 30 to 40 sec, and the peak temperature was 230 to 255° C. The package substrate was cut with a dicer into 10 mm sizes.

Separately from the above-mentioned package substrate, a substrate of 30 mm (L)×120 mm (W)×0.8 mm (T) formed with a daisy-chain circuit pattern was prepared. A cream solder paste (product name: M705-GRN360-MZ) manufactured by Senju Metal Industry Co., Ltd. was printed on an electrode terminal of this substrate. The dicer-cut package substrate was placed on this substrate such that their respective electrode terminals oppose each other through the solder ball and caused to pass through the reflow furnace, and the package substrate was mounted on the substrate, so as to yield an evaluation mounting substrate.

Figure 8:
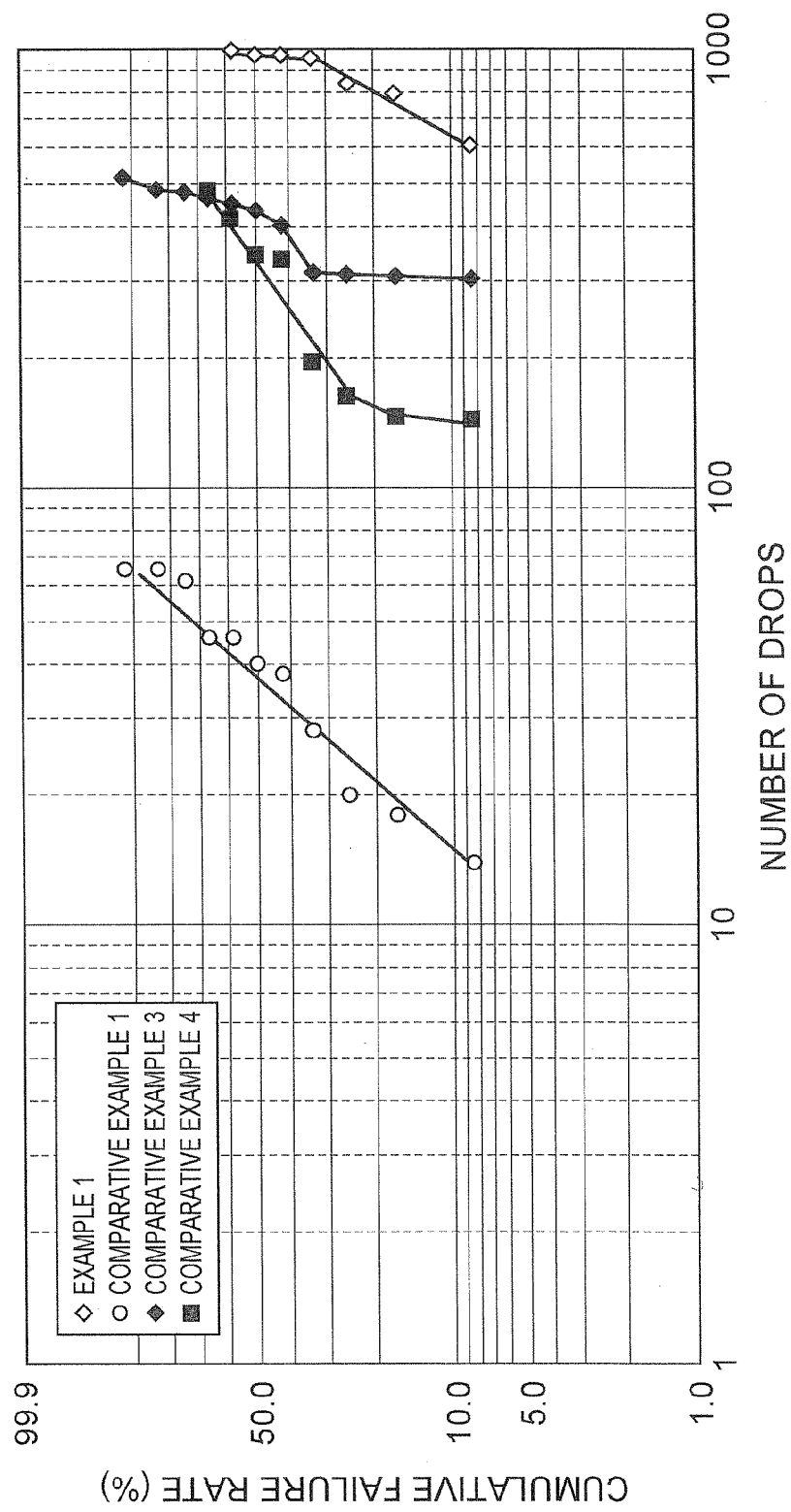
FIG. 8 is a graph illustrating the relationship between the number of drops and the cumulative failure rate in each of evaluation mounting substrates in accordance with an example and comparative examples.
Figure 9:
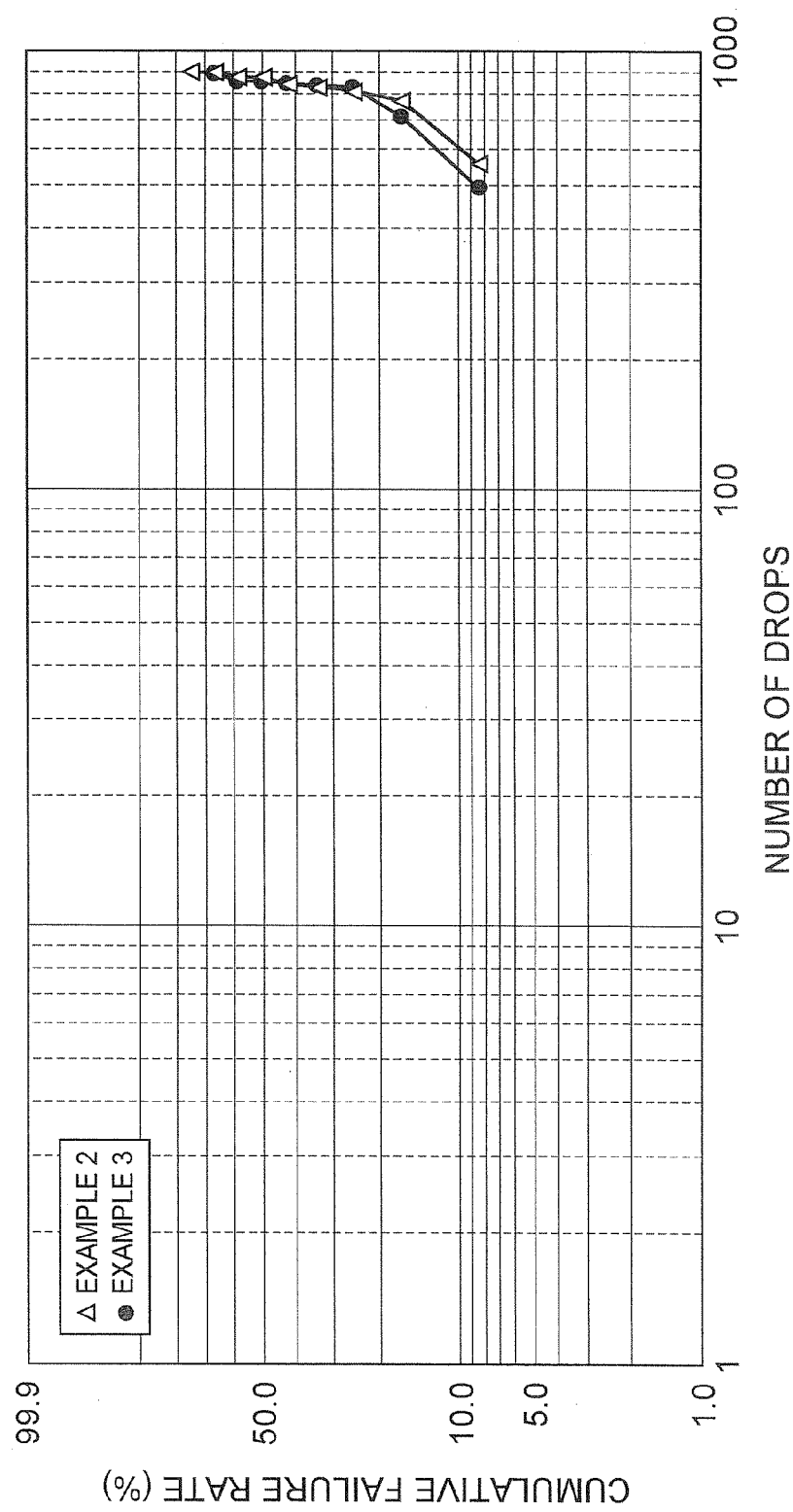
FIG. 9 is a graph illustrating the relationship between the number of drops and the cumulative failure rate in each of evaluation mounting substrates in accordance with examples.

Using a drop tester, a drop test for the evaluation mounting substrate was carried out. Specifically, at an impact acceleration of 14700 m/s², the evaluation mounting substrate was repeatedly dropped, and the resistance value between the respective electrode terminals of the package substrate and substrate was determined at each drop. Those whose resistance value became at least 1.2 times the initial resistance were evaluated as failures. Thus, the relationship between the number of drops and the cumulative failure rate was determined. Table 5 and FIGS. 8 and 9 illustrate the results. FIG. 8 is a graph illustrating the results of evaluation of drop strengths in Example 1 and Comparative Examples 1, 3, and 4, while FIG. 9 is a graph illustrating the results of evaluation of drop strengths in Examples 2 and 3.

TABLE 5

| Cumulative number of failures | Cumulative failure rate | Number of drops | | |
|---|---|---|---|---|
| | | Example 1 | Example 2 | Example 3 |
| 1 | 0.0833 | 606 | 556 | 490 |
| 2 | 0.1667 | 790 | 766 | 716 |
| 3 | 0.2500 | 832 | 813 | 826 |
| 4 | 0.3333 | 954 | 832 | 838 |
| 5 | 0.4167 | 964 | 839 | 848 |
| 6 | 0.5000 | 968 | 876 | 856 |
| 7 | 0.5833 | 992 | 867 | 858 |
| 8 | 0.6667 | — | 888 | 896 |
| 9 | 0.7500 | — | 893 | — |

As obvious from the results illustrated in Table 5 and FIGS. 8 and 9, the drop strength was seen to improve when the substrates having the plating films of Examples 1 to 3 were used.

INDUSTRIAL APPLICABILITY

The present invention can provide a plating film which can achieve sufficiently excellent drop strength when connected with solder or the like. Providing an electrode terminal with such a plating film can obtain a printed wiring board and module substrate which cannot easily break even when a shock caused by falling or the like is applied thereto. Such plating film, printed wiring board, and module substrate are useful in particular for electronic instruments, such as mobile phones, which are carried.

What is claimed is:

1. A plating film comprising:
a nickel plating layer containing phosphorus; and
a gold plating layer formed on the nickel plating layer;
    wherein the nickel plating layer has a phosphorus content of 11 to 16 mass %,
    wherein $(3\times\sigma\times100)/X$ is 10 or less, where X and σ are the average value and standard deviation of the phosphorus content in a surface of the nickel plating layer on the gold plating layer side, respectively, and
    wherein the phosphorus content in the nickel plating layer is higher as the gold plating layer is nearer.

2. A printed wiring board comprising a connection terminal having the plating film according to claim 1.

3. A module substrate comprising a connection terminal having the plating film according to claim 1 and an electronic instrument electrically connected to the connection terminal.

4. A plating film comprising:
a nickel plating layer containing phosphorus; and
a gold plating layer formed on the nickel plating layer;
    wherein the nickel plating layer has a phosphorus content of 11 to 16 mass %, and
    wherein $(3\times\sigma\times100)/X$ is equal or greater than 6.18 and is equal or less than 9.96, where X and σ are the average value and standard deviation of the phosphorus content in a surface of the nickel plating layer on the gold plating layer side, respectively.

5. The plating film according to claim 4, wherein the phosphorus content in the nickel plating layer is higher as the gold plating layer is nearer.

6. A printed wiring board comprising a connection terminal having the plating film according to claim 5.

7. A module substrate comprising a connection terminal having the plating film according to claim 5 and an electronic instrument electrically connected to the connection terminal.

8. A printed wiring board comprising a connection terminal having the plating film according to claim 4.

9. A module substrate comprising a connection terminal having the plating film according to claim 4 and an electronic instrument electrically connected to the connection terminal.

10. A plating film comprising:
a nickel plating layer containing phosphorus; and
a gold plating layer formed on the nickel plating layer;
    wherein the nickel plating layer has a phosphorus content of 11 to 16 mass %,
    wherein $(3\times\sigma\times100)/X$ is 10 or less, where X and σ are the average value and standard deviation of the phosphorus content in a surface of the nickel plating layer on the gold plating layer side, respectively, and
    wherein a range of P2/P1 is between 1.05-1.8, where P2 represents the mass percentage of the phosphorus content in the surface of the nickel plating layer on the gold plating layer side, and P1 represents the mass percentage of the phosphorus content in another surface of the nickel plating layer which is opposite to the surface on the gold plating layer side.

11. The plating film according to claim 10, wherein the phosphorus content in the nickel plating layer is higher as the gold plating layer is nearer.

12. A printed wiring board comprising a connection terminal having the plating film according to claim 11.

13. A module substrate comprising a connection terminal having the plating film according to claim 11 and an electronic instrument electrically connected to the connection terminal.

14. A printed wiring board comprising a connection terminal having the plating film according to claim 10.

15. A module substrate comprising a connection terminal having the plating film according to claim 10 and an electronic instrument electrically connected to the connection terminal.

* * * * *